(12) United States Patent
Kellam et al.

(10) Patent No.: US 12,237,255 B2
(45) Date of Patent: Feb. 25, 2025

(54) VERTICAL INTERCONNECTS WITH VARIABLE PITCH FOR SCALABLE ESCAPE ROUTING

(71) Applicant: Rambus Inc., San Jose, CA (US)

(72) Inventors: Mark D. Kellam, Siler City, NC (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 780 days.

(21) Appl. No.: 17/499,712

(22) Filed: Oct. 12, 2021

(65) Prior Publication Data
US 2022/0130745 A1    Apr. 28, 2022

Related U.S. Application Data

(60) Provisional application No. 63/104,332, filed on Oct. 22, 2020.

(51) Int. Cl.
*H01L 23/498* (2006.01)

(52) U.S. Cl.
CPC .............................. *H01L 23/49838* (2013.01)

(58) Field of Classification Search
CPC .............................................. H01L 23/49838
See application file for complete search history.

(56) References Cited

U.S. PATENT DOCUMENTS

| 2006/0017142 A1* | 1/2006 | Jang ..................... H01L 23/4951 257/676 |
| 2010/0214519 A1* | 8/2010 | Hwang ............... G02F 1/13452 257/668 |
| 2015/0220204 A1* | 8/2015 | Noguchi ............... G06F 3/0443 345/174 |
| 2018/0033753 A1* | 2/2018 | Camarota ......... H01L 23/49827 |
| 2019/0244905 A1* | 8/2019 | Yu ....................... H01L 23/5383 |

OTHER PUBLICATIONS

Wang, Renshen et al., "Layer Minimization of Escape Routing in Area Array Packaging", Department of Computer Science and Engineering, University of California, San Diego, La Jolla, CA 92093-0404, ICCAD'06, Nov. 5-9, 2006. 5 pages.

* cited by examiner

*Primary Examiner* — Michael Jung
(74) *Attorney, Agent, or Firm* — Lowenstein Sandler LLP

(57) ABSTRACT

The embodiments are directed to technologies for variable pitch vertical interconnect design for scalable escape routing in semiconductor devices. One semiconductor device includes a circuit die, and an array of circuit die interconnects located on the circuit die. The array includes a first triangular octant of interconnects that are organized in rows and columns, each column incrementing its number of interconnects from a first side of the first triangular octant to a second side of the first triangular octant. A pitch size between the columns increases in a first repeating pattern from the first side to the second side.

20 Claims, 8 Drawing Sheets

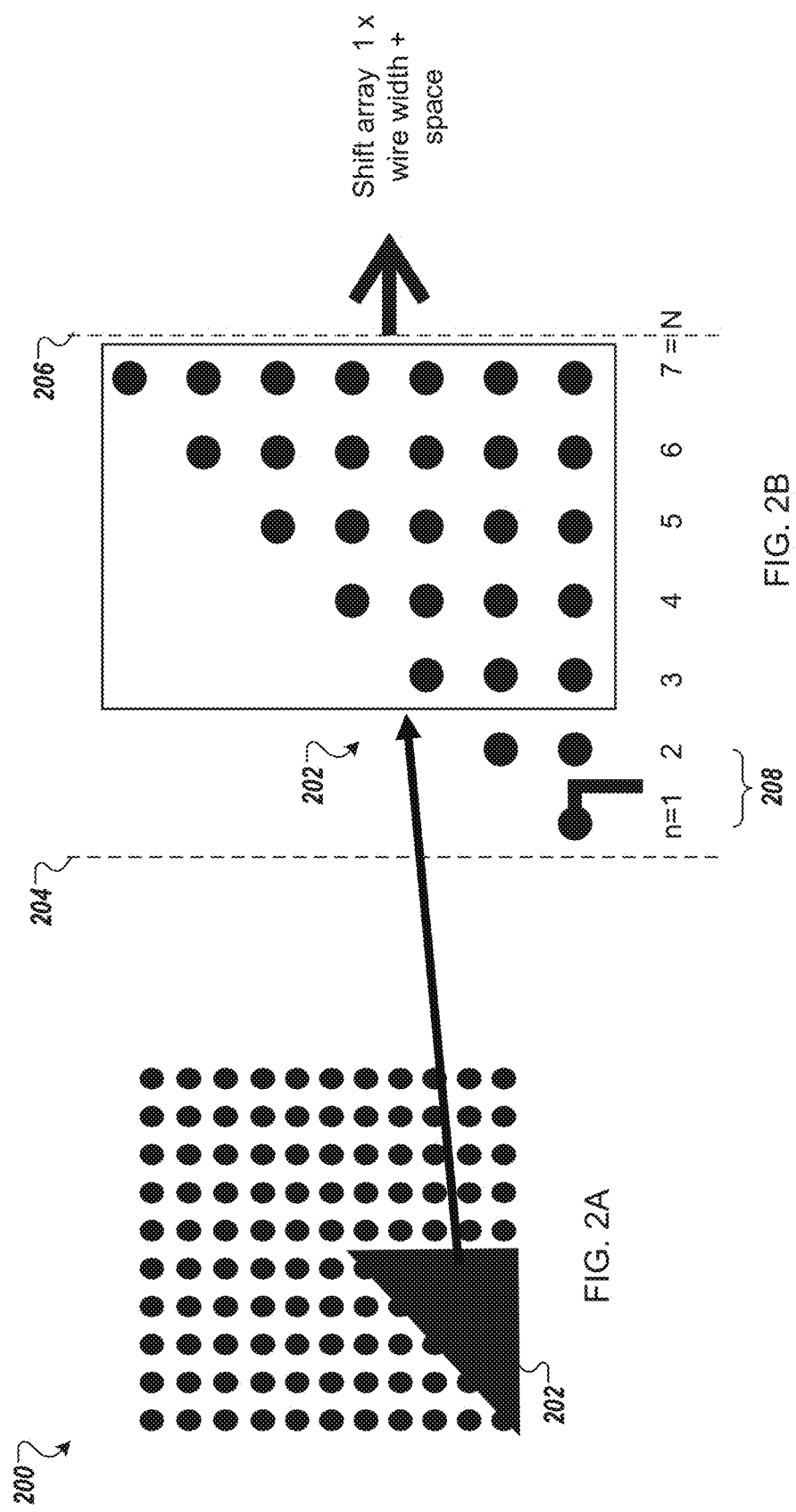

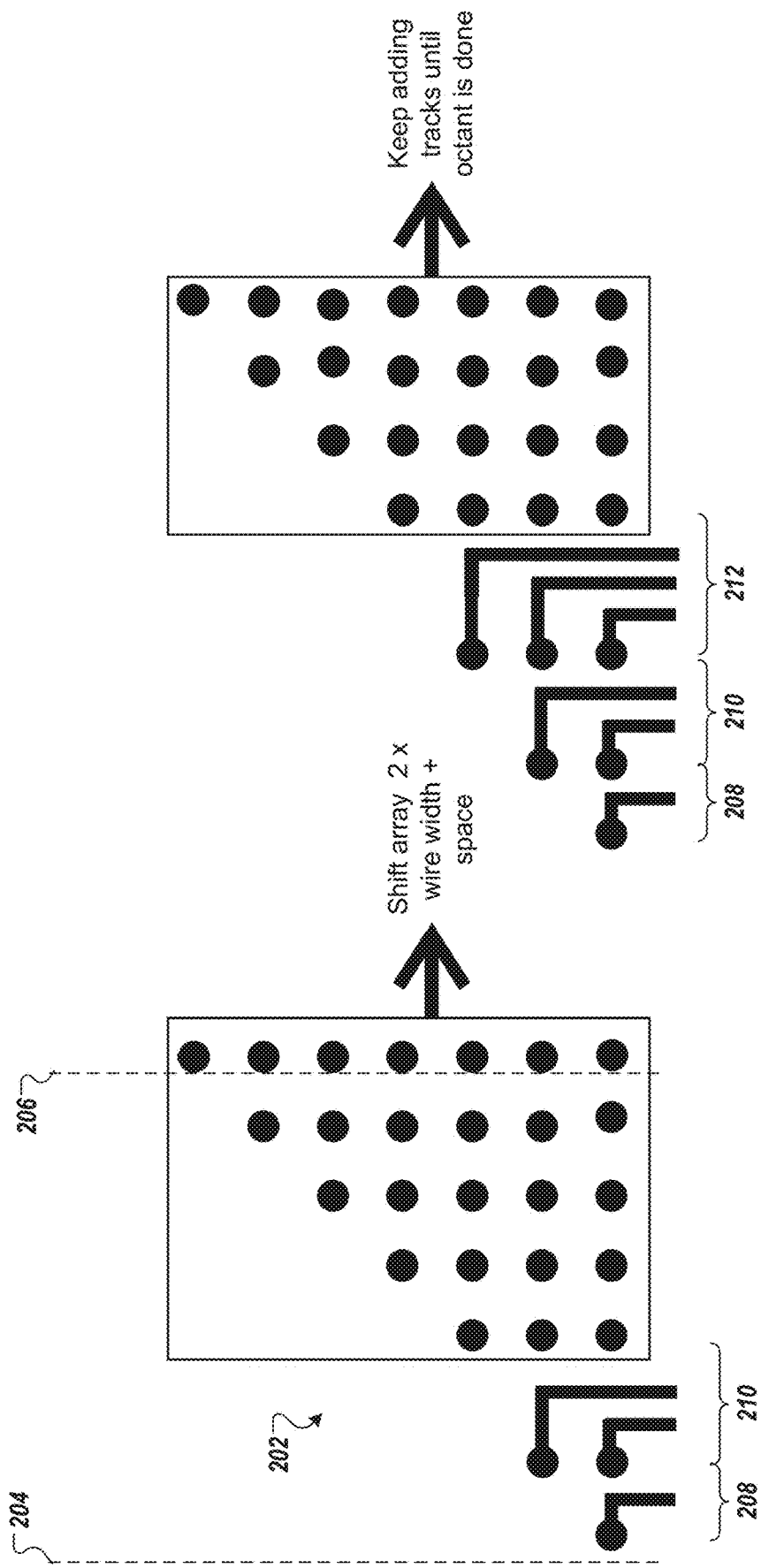

VERTICAL INTERCONNECTS WITH VARIABLE PITCH FOR SCALABLE ESCAPE ROUTING

RELATED APPLICATIONS

This application claims the benefit of U.S. Provisional Application No. 63/104,332, filed Oct. 22, 2020, the entire contents of which are incorporated herein by reference.

BACKGROUND

In high-speed electronics, the slowing of Moore's Law has produced substantial interest in alternative ways to produce high-performance connections for signals between Very Large Scale Integrated (VLSI) circuits. Three-dimensional (3D) and 2.5D packaging solutions have been used to dramatically increase memory access bandwidth for some applications, such as machine learning and high-performance computing. High Bandwidth Memory (HBM) style 3D stacked DRAM die have been attached to Graphical Processor Unit (GPU) processors via a 2.5D silicon interposer to deliver memory access bandwidth of terabytes per second (TB/sec) to highly-scaled GPU engines of the GPU processors. The recognition that dense vertical interconnects can be used for high-performance-to-power ratios has renewed interest in aggressively driving down a pitch of vertical micro-bump-grid-array (micro-BGA) interconnects to both silicon interposers and organic BGA substrates. As these vertical interconnects become dense, the classic problem of escape routing becomes more difficult.

BRIEF DESCRIPTION OF THE DRAWINGS

The present disclosure is illustrated by way of example, and not by way of limitation, in the figures of the accompanying drawings.

FIGS. 2A-2D illustrate an example of a single metal layer of a circuit die having a variable pitch that increases in pitch size in a repeating pattern according to one embodiment.

DETAILED DESCRIPTION

Many electronic devices (e.g., cell phones, tablets, set-top boxes, etc.) use integrated circuits with one or more integrated circuit dies in a semiconductor package. Vertical interconnects for packages, copper pillar substrates, and interposers are increasing in density of bumps. As a result, there is a demand to reduce a pitch of vertical interconnects in wafer bonded high-density vertical interconnects, such as copper pillar interconnect technology that has 40 micron pitch for 625 interconnects per $mm^2$ or DBI® Ultra solutions that have 100,000 to 1,000,000 interconnects per $mm^2$ with a pitch of 1-3 microns. As described above, escape routing becomes more difficult as vertical interconnects become denser and bump pitches are reduced.

Figure 1A:
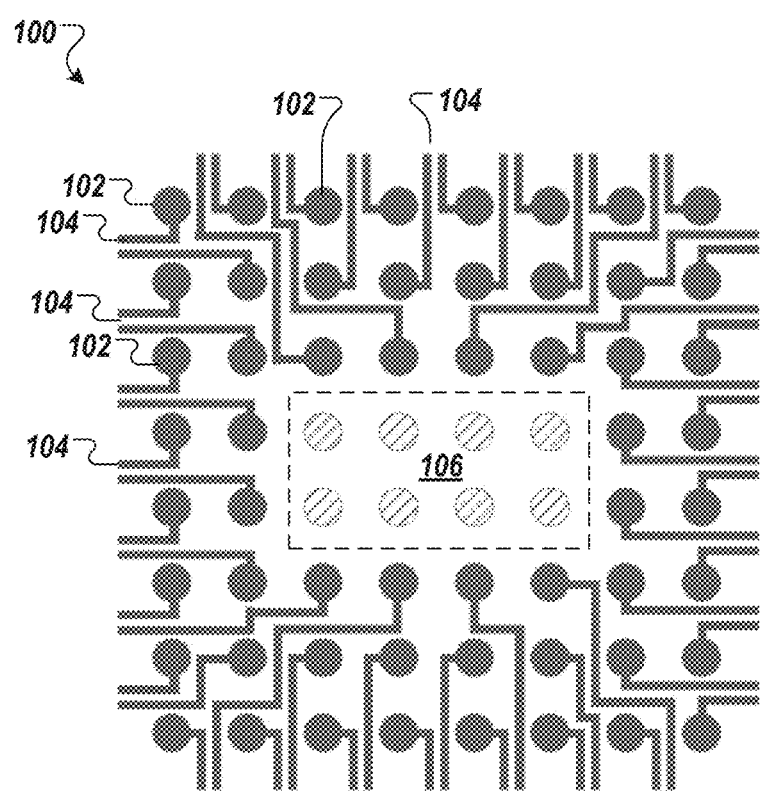
FIG. 1A illustrates a simple escape routing scheme of a circuit die with a fixed pitch where the circuit die is too large to route all vertical interconnects to an edge of the circuit die.

FIG. 1A illustrates a simple escape routing scheme of a circuit die with a fixed pitch where the circuit die is too large to route all vertical interconnects to an edge of the circuit die. Circuit die 100 has 64 micro-BGA bump pads 102 and a set of routing wires 104 in a single metal layer. Circuit die 100 has a fixed pitch between each pair of bump pads 102 in each of the rows, as well as between each pair of bump pads 102 in each of the columns. Given a bump pitch, a wiring pitch, and a number of layers available (i.e., single metal layer), a subset 106 of bump pads 102 that are more central are not routable unless 1) a number of metal routing layers is increased, 2) a number of bump count is reduced, or 3) a bump pitch or a routing wire pitch is reduced. The escape routing scheme for circuit die 100 fails to route all micro-BGA bump pads 102 of circuit die 100. It should be noted that a maximum routable die size can be calculated. As noted above, any die can be routed with enough metal routing layers. However, adding more metal routing layers adds to the cost of an integrated circuit, a semiconductor package, or an interposer of a semiconductor device.

Aspects of the present disclosure address the above problem and other deficiencies by providing solutions to the escape routing for scaled vertical interconnects and removing limitations on integrated circuits when translating between vertical and horizontal interconnects. Aspects of the present disclosure address the above problem and other deficiencies by providing a set of vertical interconnects with a variable pitch. The variable pitch of vertical interconnects can vary across a substrate as needed, producing a lower-cost design as compared to conventional rectangular or square grid approaches. The set of vertical interconnects with a variable pitch can be used for escape routing out to an edge in printed wiring boards (PWBs), printed circuit boards (PCBs), BGA packages, interposers, or the like. Aspects of the present disclosure can provide benefits for die sizes larger than a conventional routable die, and a variable pitch approach can reduce the number of routing layers. In some cases, as described herein, a variable pitch approach can reduce the number of routing layers by up to 50% of the number of routing layers in a conventionally routed die. Aspects of the present disclosure can reduce the number of routing layers needed and/or increase the number of vertical interconnects that can be routed to an edge of a semiconductor substrate as described herein.

In at least one embodiment, an array of circuit die interconnects are located on a circuit die and include a first triangular octant of interconnects that are organized in rows and columns. Each column increments its number of interconnects from a first side of the first triangular octant to a second side of the first triangular octant. A pitch size between columns increases in a first repeating pattern from a first side to the second side. A pitch size between columns that increases in a first repeating pattern can accommodate a number of routing lines to route each of the interconnects to a first side of the circuit die. In another embodiment, each row increments its number of interconnects, and a pitch size between rows increases in a first repeating pattern from a first side to a second side of a triangular octant. A pitch size between rows that increases in a first repeating pattern can accommodate a number of routing lines to route each of the interconnects to a second side of the circuit die.

In at least one embodiment, a circuit die or an IP block (also referred to as an IP core) includes an array of adjacent octants of circuit die interconnects (e.g., bumps) where the octants combine to include the entire circuit die or IP block and the octants are formed of rows (or columns), each row (or column) incrementing its number of interconnects and a pitch size between rows (or columns) increases in a repeating pattern when moving from one side of the quadrant to another.

Figure 1B:
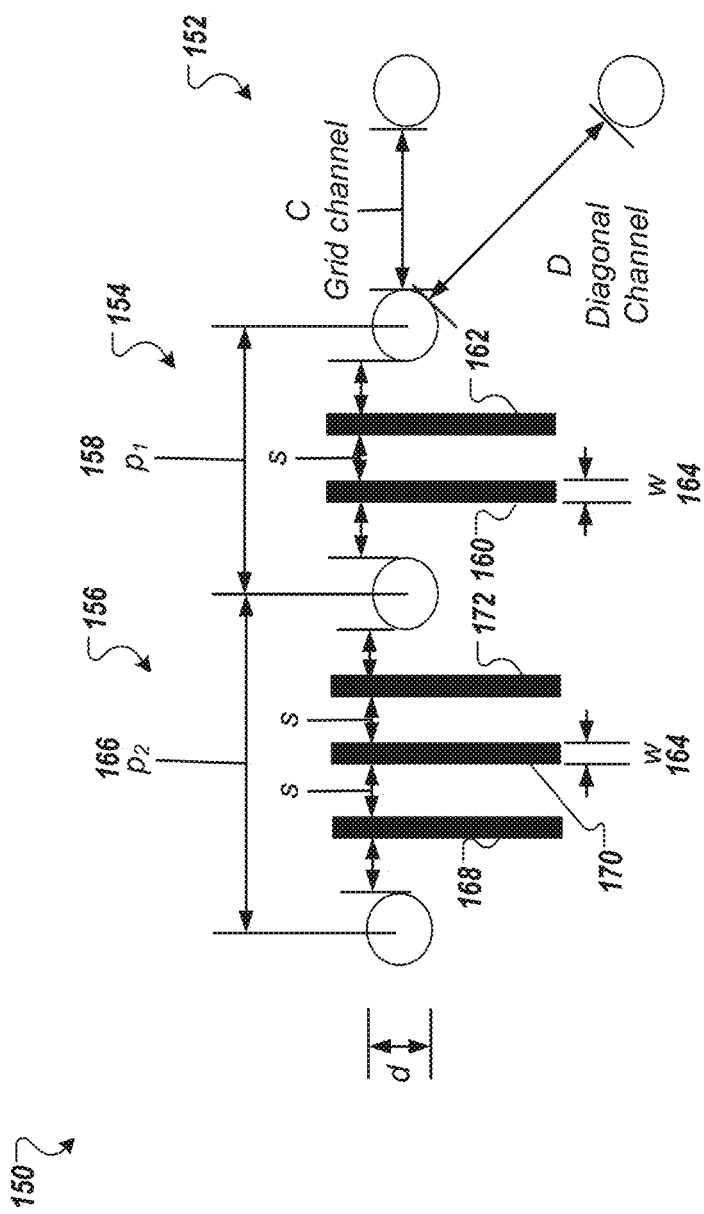
FIG. 1B illustrates a portion of a circuit die with three grid channels with a variable pitch between bumps according to at least one embodiment.

FIG. 1B illustrates a portion of a circuit die 150 with three grid channels with a variable pitch between bumps according to at least one embodiment. Circuit die 150 includes a first grid channel 152 and a second grid channel 154 with a same first pitch, $p_1$, 158. A grid channel is an area between columns or rows of bumps in which wires can be disposed for escape routing in order to connect each bump to an edge of circuit die 150. First pitch 158 accommodates two wire tracks 160, 162, each having a width, w, 164. A minimum distance between each bump and a wire track also adds to the first pitch 158. Circuit die 150 includes a third grid channel 156 with a second pitch, $p_2$, 166. Second pitch 166 accommodates three wire tracks 168, 170, 172, each having the width, w, 164. A minimum distance between each bump and a wire track also adds to the second pitch 166. Use of different pitches, as illustrated and described with respect to FIG. 1B, can address the escape routing problems as further described below with respect to FIGS. 2A-2D.

A paper by R. Wang, et al., Layer Minimization of Escape Routing in Area Array Packaging, 2006 IEEE/ACM International Conference on Computer Aided Design, Nov. 5, 2006, describes 45-degree routing channels to develop a calculation as a function of both bump pitch and routing wire pitch. Equation (1) defines a grid channel, C, and equation (2) defines a diagonal channel, D.

$$C = \frac{p-d-s}{w+s} \quad (1)$$

$$D = \frac{\sqrt{2}p-d-s}{w+s} \quad (2)$$

A maximum edge bump count can be calculated using the quadratic inequality, as expressed in equation (3):

$$-2(D+1)(D+2)k^2+[4(D+1)n-10D+8C]k-n^2 \geq 0, \quad (3)$$

where n is the number of bumps per die edge, k is the number of metal routing layers, and n*p is a die edge length.

In one embodiment, using a quadratic equation given by the paper, a maximum die size as a function of bump pitch and a number of metal layers can be computed. As noted herein, adding more routing layers or increasing the bump pitch can be used to address the escape routing problem. It should be noted that "a maximum die size" is a die size that can be routed without increasing metal layers or reducing a total routing density. Adding more layers of routing or increasing the bump pitch can still be used for escape routing. For example, in commercial settings, difficult escape routing problems are commonly solved by adding a number of routing layers to the package and increasing the package cost. Package cost will be represented by routing layer count when comparing conventional approaches to the embodiments described herein. However, unlike the paper that describes 45-degree routing channels in a circuit die with a fixed pitch, a pitch size (also referred to as bump pitch) can vary, as illustrated in the grid channels of FIG. 1B. FIG. 1B defines the parameters used to calculate the maximum routable die size when the pitch size is fixed for the first two columns, and the pitch size is increased for the third column.

In one embodiment, an array of bumps can have a variable pitch disposed on a square or rectangular die surface of any size, all of which are fully routed to the die edges using multiple layers of metal having a fixed pitch and traveling in channels perpendicular to the die edges between the bump columns. The pitch of adjacent bump columns can begin at a minimum value in a die corner and increase by one wire pitch when the total number of wires in the previous channel is insufficient to connect to all bumps in the next channel. Before presenting a detailed multi-level metal embodiment, a simple single metal level routing embodiment is presented in FIGS. 2A-2D in order to develop an intuitive understanding of a die surface having a variable pitch.

FIGS. 2A-2D illustrate an example of a single metal layer of a circuit die 200 having a variable pitch that increases in pitch size in a repeating pattern according to one embodiment. Circuit die 200 can be separated into eight octants, and a first triangular octant 202 is illustrated to show the repeating pattern that will be repeated for the other triangular octants, but mirrored (or folded) from the first triangular octant 202. First triangular octant 202 includes multiple bumps (or other types of circuit die interconnects) that are organized in an array of rows and columns, each column incrementing its number of interconnects from a first side 204 of the first triangular octant 202 to a second side 206 of the first triangular octant 202. As illustrated in FIGS. 2B-2D, a first column includes a first bump, a second column includes two bumps, a third column includes three bumps, and so on up to a seventh column including seven bumps. A first wire is coupled to a first bump in a first column. The first wire is located in a grid channel with a first pitch 208 between the first column and a second column.

In one embodiment, a ball grid is initialized with enough space to route exactly one wire between columns of balls, as illustrated in FIG. 2A. These illustrations show only one octant of the full die pattern, and reflections of a final wire-ball pattern can generate the other octants. Beginning at a left lower corner, a first ball is wire connected, as illustrated in FIG. 2A. The second column space, also referred to as a second grid channel, between the columns of balls is not wide enough to route the two balls in the second column, so the ball grid array is shifted right by one wire pitch to provide enough routing resources to fully route the balls. As illustrated in FIG. 2B, the balls (as labeled with the surrounding box) are shifted right by one wire pitch.

In order to accommodate additional wires between columns as the number of balls (or other bump interconnects) increases, the array is shifted by one wire width plus some fixed space needed between wires and balls, such as illustrated in FIG. 2C. Although the columns in FIG. 2B are illustrated with fixed pitch sizes, these pitch sizes between columns increase in a first repeating pattern from the first side 204 to the second side 206.

Referring to FIG. 2C, two wires are coupled to the two balls of the second column. The two wires are located in a second pitch 210 between the second column and a third column. FIG. 2C shows the routing of a second channel with a pitch to accommodate two wires. In order to accommodate additional wires between columns as the number of balls increases, the array is shifted by one wire width plus some fixed space needed between wires and balls, such as illustrated in FIG. 2D.

Referring to FIG. 2D, three wires are coupled to the three balls of the third column. The three wires are located in a third pitch 212 between the third column and a fourth column. In order to accommodate additional wires between columns as the number of balls increases, the array is shifted by one wire width plus some fixed space needed between wires and balls, such as illustrated in FIG. 2D. To route a third channel, two additional wire pitches need to be inserted to the right of the three balls in the third column. Additional wire tracks can be added until the first triangular octant 202 is done with escape routing for the multiple balls. Alternatively, the first triangular octant 202 can have vertical interconnects of other types, such as bumps, pillars, or the like.

As illustrated in FIGS. 2A-2D, a pitch size between columns increases in the first repeating pattern from the first side 204 to the second side 206. By continuing this process from the corner to the center of the die edge, a total number of wires used, including the Nth column is equal to a number of bumps. It can be computed by an arithmetic sum as set forth in equation (4):

$$N_w = N_B = \sum_1^N n = \frac{N(N+1)}{2} \quad (4)$$

As noted above, the first repeating pattern can be used in a second octant that is adjacent to the second side. In some cases, the first repeating pattern starts from an opposite side of the circuit die and goes from one side back to the middle towards the second side 206. Alternatively, a second repeating pattern can be used, where a pitch size between columns decreases from a first side to a second side, the first side being adjacent to the second side 206. In another embodiment, a third octant can be mirrored about a diagonal axis of the first triangular octant 202.

In one embodiment, the first triangular octant 202 is part of an array of circuit die interconnect of a circuit die, and the circuit die includes a rectangular die surface. The array of circuit die interconnects can be an array of bumps disposed on the rectangular die surface, each bump of the array of bumps being routed to a die edge using a wire, the wire having a fixed pitch, and being located in a wiring channel that is perpendicular to the die edge and between two of the columns. In a first embodiment, a first set of one or more wiring channels each includes a first pitch size, and a second set of one or more wiring channels each includes a second pitch size that is greater than the first pitch size by at least the fixed pitch of a wire. In a further embodiment, the first set of one or more wiring channels is located at a first die corner of the circuit die. Each channel of the first set has a first pitch size that accommodates one wire in each of multiple metal layers. The second set of one or more wiring channels is located adjacent to the first set of one or more wiring channels. Each channel of the second set has a second pitch size that accommodates two wires in each of the multiple metal layers.

As described above with respect to the first triangular octant 202, the first repeating pattern includes i) a first set of wiring channels, each wiring channel of the first set including a second set of routing wires in one or more routing layers of the circuit die, and each wiring channel of the first set including a first pitch size between respective columns; and ii) a first wiring channel including a second set of routing wires in the one or more routing layers and including a second pitch size between respective columns, the second pitch size being greater than the first pitch size. In one embodiment, the first set of wiring channels includes a first number of wiring channels that is based on a second number of the one or more routing layers. In a further embodiment, the first repeating pattern further includes iii) a second set of wiring channels, each wiring channel of the second set including a third set of routing wires in the one or more routing layers of the circuit die, and each wiring channel of the second set including a third pitch size between respective columns, the third pitch size being greater than the second pitch size; and iv) a second wiring channel including a fourth set of routing wires in the one or more routing layers and including a fourth pitch size between respective columns, the fourth pitch size being greater than the third pitch size. In one embodiment, the second set of wiring channels includes the same first number of wiring channels as the first set of wiring channels.

It should be noted that circuit die 200 illustrates an example of a single metal layer. In other embodiments, more than one metal layer can be used. Having multiple metal layers can define how often a pitch size between columns is increased, such as illustrated and described below with a detailed multi-level metal embodiment of FIGS. 3A-4.

Figure 3A:
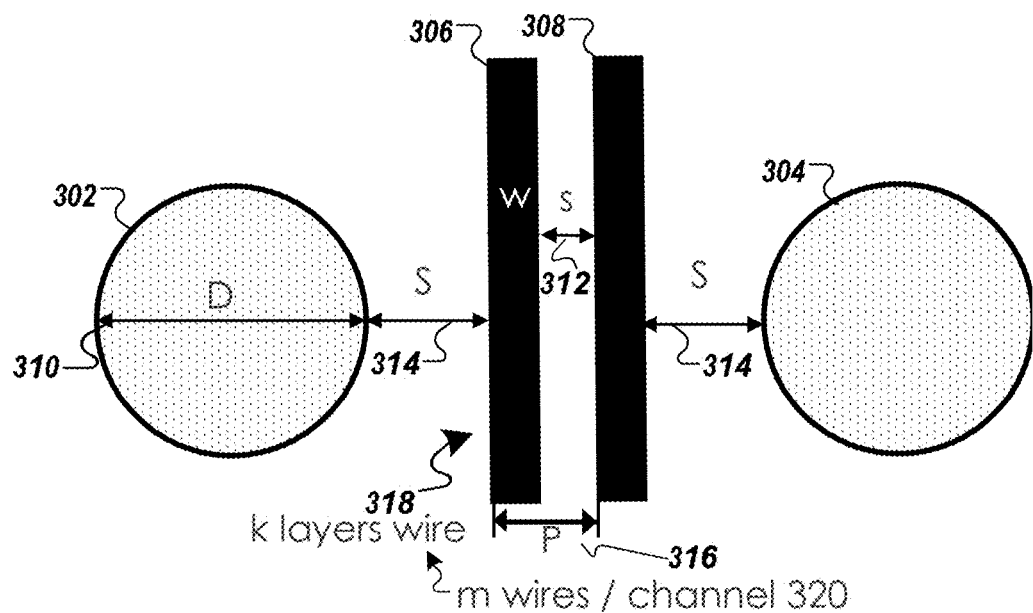
FIG. 3A illustrates two bumps and two wires for a multilayer wire system according to at least one embodiment.

FIG. 3A illustrates two bumps 302, 304 and two wires 306, 308 for a multilayer wire system according to at least one embodiment. FIG. 3A defines the variables used in an analysis for a multilayer wire system, including: a bump size D 310 for each of the two bumps 302, 304; a wire space 312, s; a bump space to wire 314, S; a wire pitch 316, p (e.g., w+s); a number of levels of metal wires 318, k; and a number of wires per routing channel 320, m.

Figure 4:
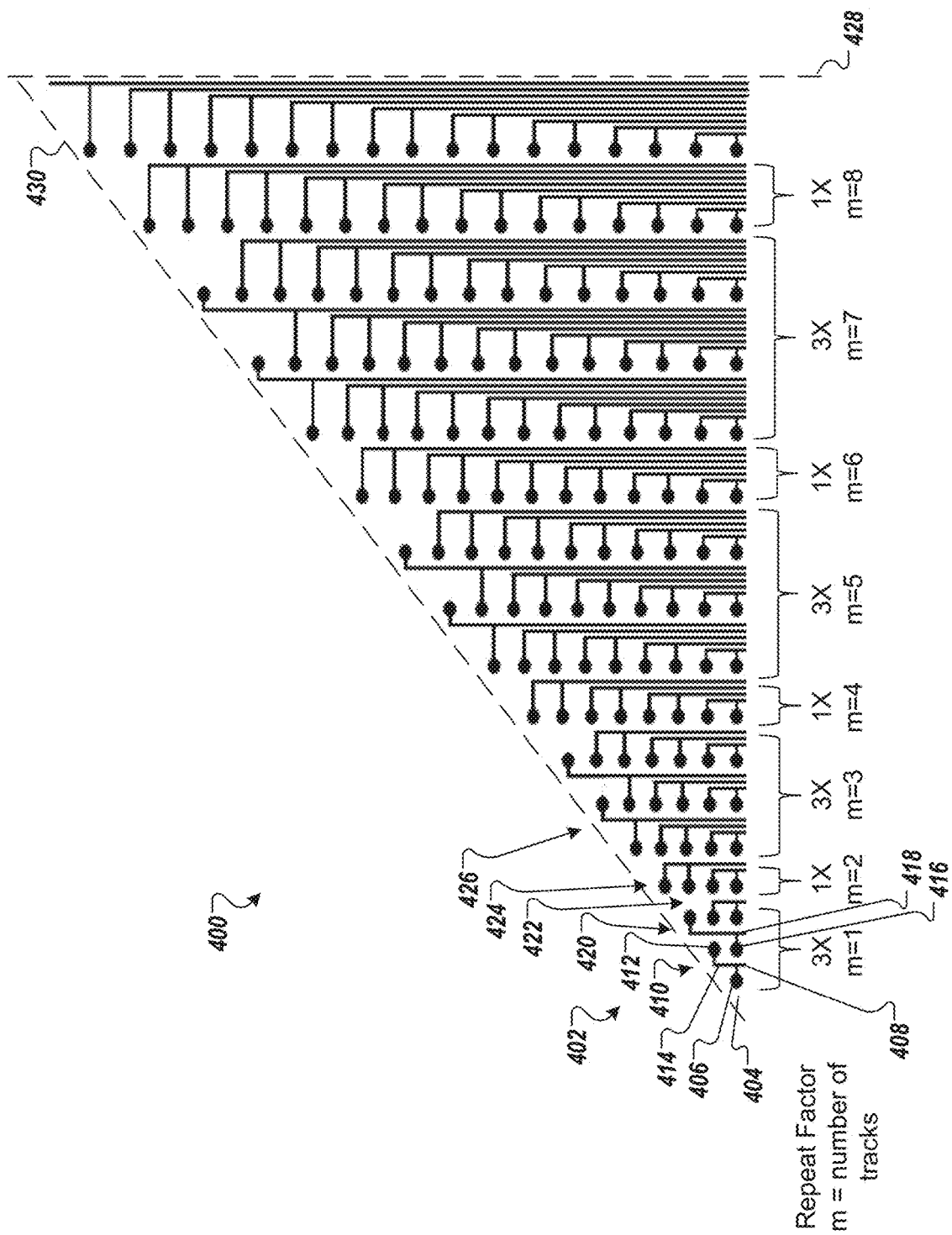
FIG. 4 illustrates an example of two metal layers of a triangular octant of a circuit die having a variable pitch that increases in pitch size in a repeating pattern according to at least one embodiment.

The strategy for routing the interconnects to the bumps follows from starting with a minimum number of routing wires at the edge of the die and increasing the number of multilayer wire tracks wires in a routing channel by one wire when the number of target bumps along the channel exceeds the number of wires available in the channel, as illustrated in FIG. 4.

FIG. 4 illustrates an example of two metal layers of a triangular octant of a circuit die having a variable pitch that increases in pitch size in a repeating pattern according to at least one embodiment. As shown in FIG. 4, escape routing of the circuit die is achieved by starting at a corner of the die and labeling the columns of bumps with an integer, n, that counts a number of columns from the die's corner. To determine the number of wires required to exactly route all the bumps up to and including column n2 but greater than column n1, the following equation (5) can be used:

$$\sum_{n1}^{n2} n = \frac{n2(n2+1)}{2} - \frac{n1(n1+1)}{2} \quad (5)$$

Figure 3B:
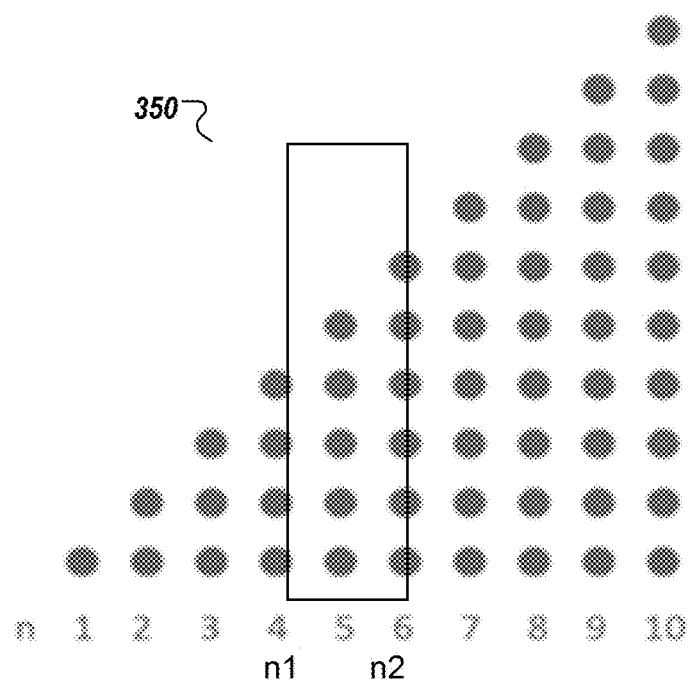
FIG. 3B illustrates a triangular octant with an array of bumps according to at least one embodiment.

For example, to verify by inspection, two columns, n1=4 and n2=6, are labeled in a box 350 in FIG. 3B, where a sum of bumps is eleven (e.g., $$\left(e.g., \frac{6*7}{2} - \frac{4*5}{2} = 11\right).$$

The sum includes the columns up to and including n2, but does not include the bumps in column n1. FIG. 3B illustrates a triangular octant with an array of bumps according to at least one embodiment.

In the case that column n1 is successfully routed with a channel having m wire tracks and k levels of metal, the next channel n1+1 (n2) has too many bumps to be routed with m wires, where m represents the number of wires per channel. For the next channel, n2, the variable m is incremented by one, and the number of available wires is set equal to the total bumps to route between column n2 and n1. The solution to this quadratic equation defines the next column number that would require another increment in the number of wire tracks m per channel, such as expressed in equation (6).

$$\sum_{n1}^{n2} n = \frac{n2(n2+1)}{2} - \frac{n1(n1+1)}{2} = k(m+1)(n2-n1) \quad (6)$$

The solution n2(n1) to equation (6) is a recursion relation that generates the progression of wire counts per channel as one routes from the corner into the denser center portion of the die. This solution is represented by equation (7):

$$n2 = \frac{2k(m+1) - 1 \mp \sqrt{[2k(m+1)-1]^2 - [n1(n1+1) - 2k\,n1(m+1)]}}{2} \quad (7)$$

This recursion relation produces a very simple and elegant pattern in the wires required to route the bumps exactly. An example of two metal layers of a triangular octant is illustrated in FIG. 4.

Referring to FIG. 4, triangular octant 400 includes seventeen columns and increases a pitch according to a repeating pattern with a repeating factor, m, representing a number of tracks in a routing channel. Repeating factor, m, is also referred to as track density. Triangular octant 400 includes a first set of columns 402 at a first corner 404 of a circuit die or a portion of a circuit die. A first column includes a first bump 406 routed to a die edge using a first wire 408. It should be noted that wire, as used herein, can be referred to as any type of conductor that can be used to connect a die interconnect to a die edge. First wire 408 has a fixed pitch and is located in a first wiring channel 410 that is perpendicular to the die edge and between the first column and a second column. The second column includes a second bump 412 that is routed to the die edge using a second wire 414. First wire 408 can be routed to the die edge in a first metal layer, and second wire 414 can be routed to the die edge in a second metal layer. The first bump 406 and the second bump 412 can be in the same first metal layer as the first wire 408. Alternatively, the first bump 406 and second bump 412 can be in the same second metal layer as the second wire 414. First wiring channel 410 accommodates two wires in a single wire track, one wire in each metal layer within the single wire track. The second column also includes a third bump 416 that is routed to the die edge using a third wire 418 in a second wiring channel 420. A third column includes a fourth bump that is routed to the die edge using a fourth wire in the second wiring channel 420. Second wiring channel 420 accommodates two wires in a single wire track, one wire in each metal layer within the single wire track. The third column also includes a fifth bump that is routed to the die edge using a fifth wire in a third wiring channel and a sixth bump that is routed to the die edge using a sixth wire in the third wiring channel. The third wiring channel accommodates two wires in a single wire track, one wire in each metal layer within the single wire track. As illustrated in the first set of columns 402, the repeating pattern begins at the first corner with a track density of m=1 for the first wiring channel 410 at the first corner 404, the track density of m=1 is repeated 2k−1 number of times. Since there are two metal layers, k is two, so the track density is repeated 3 times (e.g., 2k−1=3, where k=2). For a next wiring channel 424, the track density, m, is incremented by one to provide two wire tracks, instead of one wire track. In one embodiment, m is incremented by one for the next channel only. In particular, for the first set of columns 402, the track density is equal to 1. For the next wiring channel 424, which includes four bumps, the track density equals 2 (e.g., m=2). Since there are two metal layers, all four bumps are routed to the die edge using four separate wires on the two metal layers. That is, a fourth wiring channel accommodates four wires, two wires in a first set of two wire tracks in a first metal layer and another two wires in a second set of two wire tracks in a second metal layer. The first wiring channels include a first pitch size, and the fourth wiring channel includes a second pitch size that is greater than the first pitch size by at least the fixed pitch of a wire.

For a next wiring channel 426, the track density, m, is incremented by one to provide three wire tracks, instead of two wire tracks. In particular, for the next wiring channels 426 of a second set of columns, the track density equals 3. For each wiring channel in the second set of columns, there are three wiring tracks, accommodating six wires on the two metal layers. Since there are two metal layers, all bumps are routed to the die edge. Each wiring channel of the second set of columns 426 includes a first pitch size and the fourth wiring channel includes a third pitch size greater than the second pitch size by at least the fixed pitch of a wire. This repeating pattern is repeated until the full triangular octant 400 is routed, as illustrated in FIG. 4.

In another embodiment, the first set of one or more wiring channels is located at a first die corner of the circuit die. Each channel of the first set has a first pitch size that accommodates one wire in each of one or more metal layers. A second set of one or more wiring channels is located adjacent to the first set of one or more wiring channels, and each channel of the second set has a second pitch size that accommodates two wires in each of the one or more metal layers.

Referring to FIG. 4, the first triangular octant 400 includes multiple circuit die interconnects, illustrated as bumps or balls of a grid array. The circuit die interconnects are located on the circuit die and organized in rows and columns. Each column increments its number of interconnects from a first side of the first triangular octant 400 to a second side of the first triangular octant 400. As described above, a pitch size between the columns increases in a first repeating pattern from the first side to the second side. The circuit die can include a second triangular octant of interconnects organized in rows and columns. The second triangular octant is a mirrored copy of the first triangular octant 400 about an axis 428 at the second side of the first triangular octant 400. The first triangular octant 400 and the second triangular octant form a first triangular quadrant of the circuit die. The first quadrant can be mirrored as well for the other quadrants of the circuit die. In one embodiment, the second triangular octant of interconnects are organized in rows and columns, each column decrementing its number of interconnects from a first side of the second triangular octant to a second side of the second triangular octant, the first die of the second triangular octant being adjacent to the second side of the first triangular octant 400. A pitch size between the columns of the second triangular octant decreases in a second repeating pattern from the first side to the second side of the second triangular octant. In one embodiment, the first repeating pattern and the second repeating pattern are opposite repeating patterns. Alternatively, the first and second repeating patterns can have other dissimilar patterns.

In another embodiment, the circuit die can include a second triangular octant of interconnects organized in rows and columns. The second triangular octant is a mirrored copy of the first triangular octant 400 about a diagonal axis 430 between the first side and the second side of the first triangular at the second side of the first triangular octant 400. The first triangular octant 400 and the second triangular octant form a first rectangular quadrant (or square quadrant) of the circuit die. It should be noted that the second triangular octant increases pitch size between rows in a similar repeating pattern from the first corner 404 at a first side to a second side of the second triangular octant. In one embodiment, the second triangular octant of interconnects is organized in rows and columns, each row incrementing its number of interconnects from a first side of the second triangular octant to a second side of the second triangular octant, where a diagonal axis of the second triangular octant is adjacent to the diagonal axis 430 of the first triangular octant. In one embodiment, the first repeating pattern and the second repeating pattern are the same repeating patterns. Alternatively, the first and second repeating patterns can have dissimilar patterns.

Figure 5:
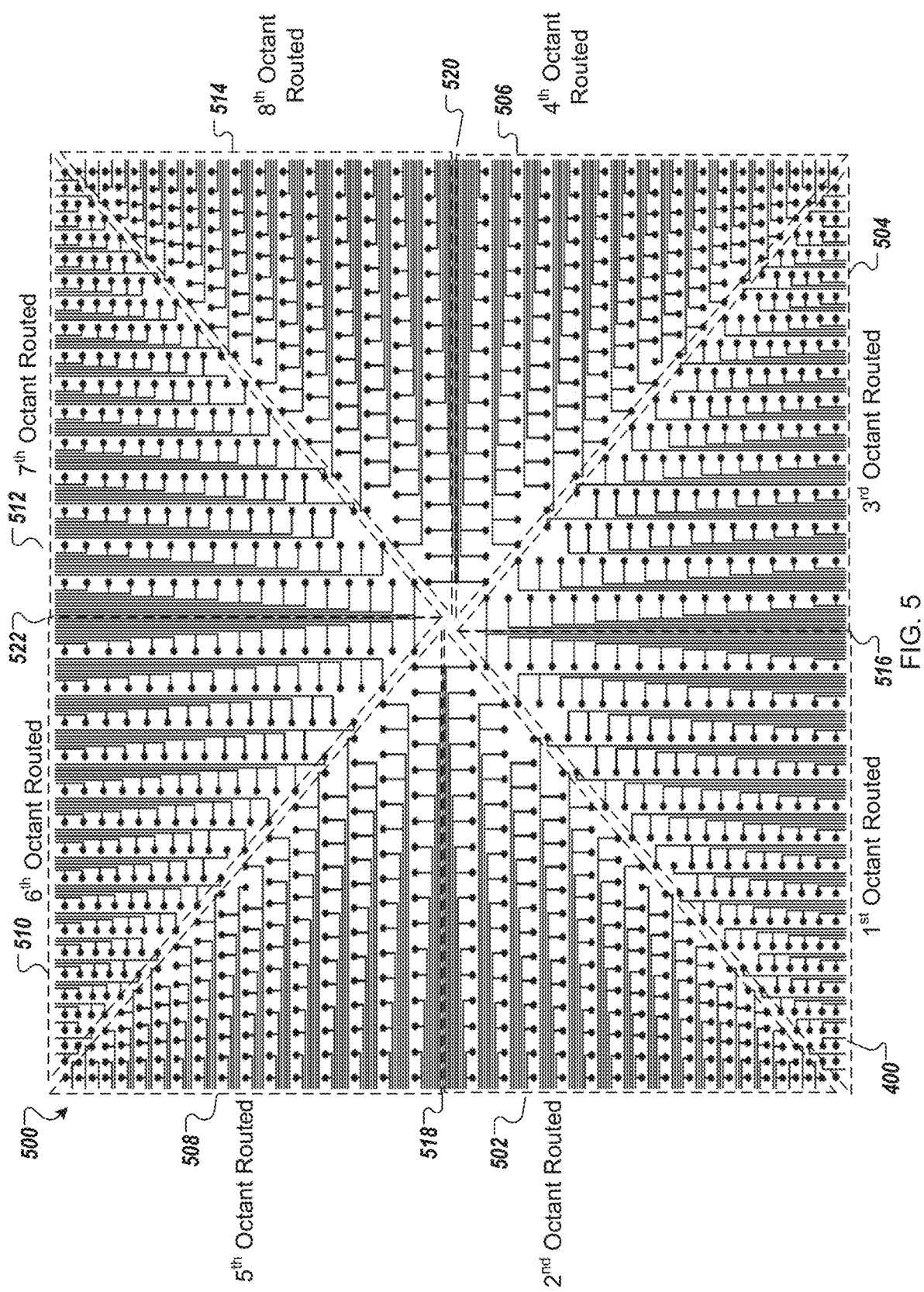
FIG. 5 illustrates a circuit die or a portion of a circuit die, including eight octants with variable pitches according to at least one embodiment.

In at least one embodiment, the first triangular octant 400 can be folded or mirrored for the other seven triangular octants, such as illustrated in a circuit die or a portion of a circuit die of FIG. 5.

FIG. 5 illustrates a circuit die 500 (or a portion of a circuit die), including eight octants with variable pitches according to at least one embodiment. Circuit die 500 (or a portion of a circuit die) includes the first triangular octant 400 as described above and illustrated with respect to FIG. 4. The first triangular octant 400 includes a pitch size that varies to accommodate routing lines (e.g., wires) between bumps of the first triangular octant 400 to a first edge 516 of circuit die 500. A second triangular octant 502 includes a similar repeating pattern with a pitch size that varies between rows to accommodate routing lines (e.g., wires) between bumps of the second triangular octant 502 to a second edge 518 of circuit die 500. A third triangular octant 504 includes a pitch size that varies between columns to accommodate routing lines (e.g., wires) between bumps of the third triangular octant 504 to the first edge 516 of circuit die 500. A fourth triangular octant 506 includes a similar repeating pattern with a pitch size that varies between rows to accommodate routing lines (e.g., wires) between bumps of the fourth triangular octant 506 to a third edge 520 of circuit die 500. A fifth triangular octant 508 includes a pitch size that varies between rows to accommodate routing lines (e.g., wires) between bumps of the fifth triangular octant 508 to the second edge 518 of circuit die 500. A sixth triangular octant 510 includes a similar repeating pattern with a pitch size that varies between columns to accommodate routing lines (e.g., wires) between bumps of the sixth triangular octant 510 to a fourth edge 522 of circuit die 500. A seventh triangular octant 512 includes a similar repeating pattern with a pitch size that varies between columns to accommodate routing lines (e.g., wires) between bumps of the seventh triangular octant 512 to the fourth edge 522 of circuit die 500. An eighth triangular octant 514 includes a similar repeating pattern with a pitch size that varies between rows to accommodate routing lines (e.g., wires) between bumps of the eighth triangular octant 514 to the third edge 520 of circuit die 500.

It should be noted that similar patterns emerge for any number of metal layers. For example, for k=5 levels of metal, the number of repeated internal wiring channels with the same m count will be 2k−1=9. These groupings of 9 wiring channels with the same m value are separated by single wiring channels where the wire count exactly equals the number of bumps in the column to be routed. For the groups of wiring channels with a common value for m, the earliest channels will contain "extra wires" that are laterally routed to connect to bumps in the neighboring column. The later columns of bumps in the group have a deficit of wires that exactly matches the "extra" wires in the start of the group, leading to a precise match of the bump count and wire count contained in the group. In some embodiments, this requirement is the condition defined by the quadratic and its solution.

In another embodiment, a semiconductor device includes a substrate with a rectangular or square surface. The semiconductor device can be an entire die or a portion of a die, such as an IP block integrated into a larger circuit design. The semiconductor device is or can be a part of a printed wiring board (PWB), a ball grid array (BGA) package, an interposer, a functional circuit block (e.g., an intellectual property (IP) block or IP core), or the like. The vertical interconnects can be used between a die and a package, between a chip scale packing (CSP) and a board, or between a BGA and a board for vertical to horizontal interconnections, also referred to herein as escape routing.

In one embodiment, a first triangular octant of vertical interconnects, such as the first triangular octant 400 described above with respect to FIGS. 4-5, is disposed on the rectangular or square surface of the substrate. The vertical interconnects of the first triangular octant are organized in rows and columns, each column incrementing its number of interconnects from a first side of the first triangular octant to a second side of the first triangular octant. In another embodiment, the vertical interconnects are organized in rows and columns, and each row increments its number of interconnects from one side to another. In the case of the columns incrementing, the first triangular interconnect also includes a first set of wiring channels. Each wiring channel of the first set includes a first set of routing wires in one or more routing layers of the substrate, and each wiring channel of the first set includes a first pitch size between respective columns. The first triangular interconnect also includes a first wiring channel with a second set of routing wires in the one or more routing layers and a second pitch size between respective columns, the second pitch size being greater than the first pitch size. The first set of wiring channels can include a first number of wiring channels that is based on a second number of the one or more routing layers. In a further embodiment, the first triangular octant further includes a second set of wiring channels. Each wiring channel of the second set includes a third set of routing wires in the one or more routing layers of the substrate, and each wiring channel of the second set of wiring channels includes a third pitch size between respective columns, the third pitch size being greater than the second pitch size. The first triangular octant further includes a second wiring channel with a fourth set of routing wires in the one or more routing layers and a fourth pitch size between respective columns, the fourth pitch size being greater than the third pitch size. The second set of wiring channels can include the same first number of wiring channels as the first set of wiring channels.

In a further embodiment, a semiconductor device can include a second triangular octant of vertical interconnects disposed on the rectangular surface adjacent to the second side of the first triangular octant. The second triangular octant of vertical interconnects can be organized in rows and columns. Each column decreases its number of interconnects from a first side of the second triangular octant to a second side of the second triangular octant. Similarly, the second triangular octant can be organized in rows and columns, and each row decrements its number of interconnects from one side to another. The second triangular octant also includes iii) a second set of wiring channels, each wiring channel of the second set of wiring channels including a third set of routing wires in one or more routing layers of the substrate, and each wiring channel of the second set of wiring channels including a third pitch size between respective columns; and iv) a second wiring channel with a fourth set of routing wires in the one or more routing layers and a fourth pitch size between respective columns, the fourth pitch size being less than the third pitch size.

In a further embodiment, a semiconductor device can include a second triangular octant of vertical interconnects disposed on the rectangular surface adjacent to a diagonal side of the first triangular octant, the second triangular octant of vertical interconnects being organized in rows and columns, each row (or alternatively column) incrementing its number of interconnects from a first side of the second triangular octant to a second side of the second triangular octant. The second triangular octant also includes iii) a second set of wiring channels, each wiring channel of the second set of wiring channels including a third set of routing wires in one or more routing layers of the substrate, and each wiring channel of the second set of wiring channels including a third pitch size between respective rows; and iv) a second wiring channel with a fourth set of routing wires in the one or more routing layers and a fourth pitch size between respective rows, the fourth pitch size being greater than the third pitch size.

Although circuit die 500 includes a square shape, in other embodiments, other shapes of circuit dies, including the shapes that make up the overall shape of the circuit die can vary. For example, a circuit die can have a rectangular shape, and an octant (or other section) can have a first portion that is triangular and a second portion that is square or rectangular, such as towards a center of the circuit die where a bump count is no longer increasing, such as illustrated in FIG. 6.

Figure 6:
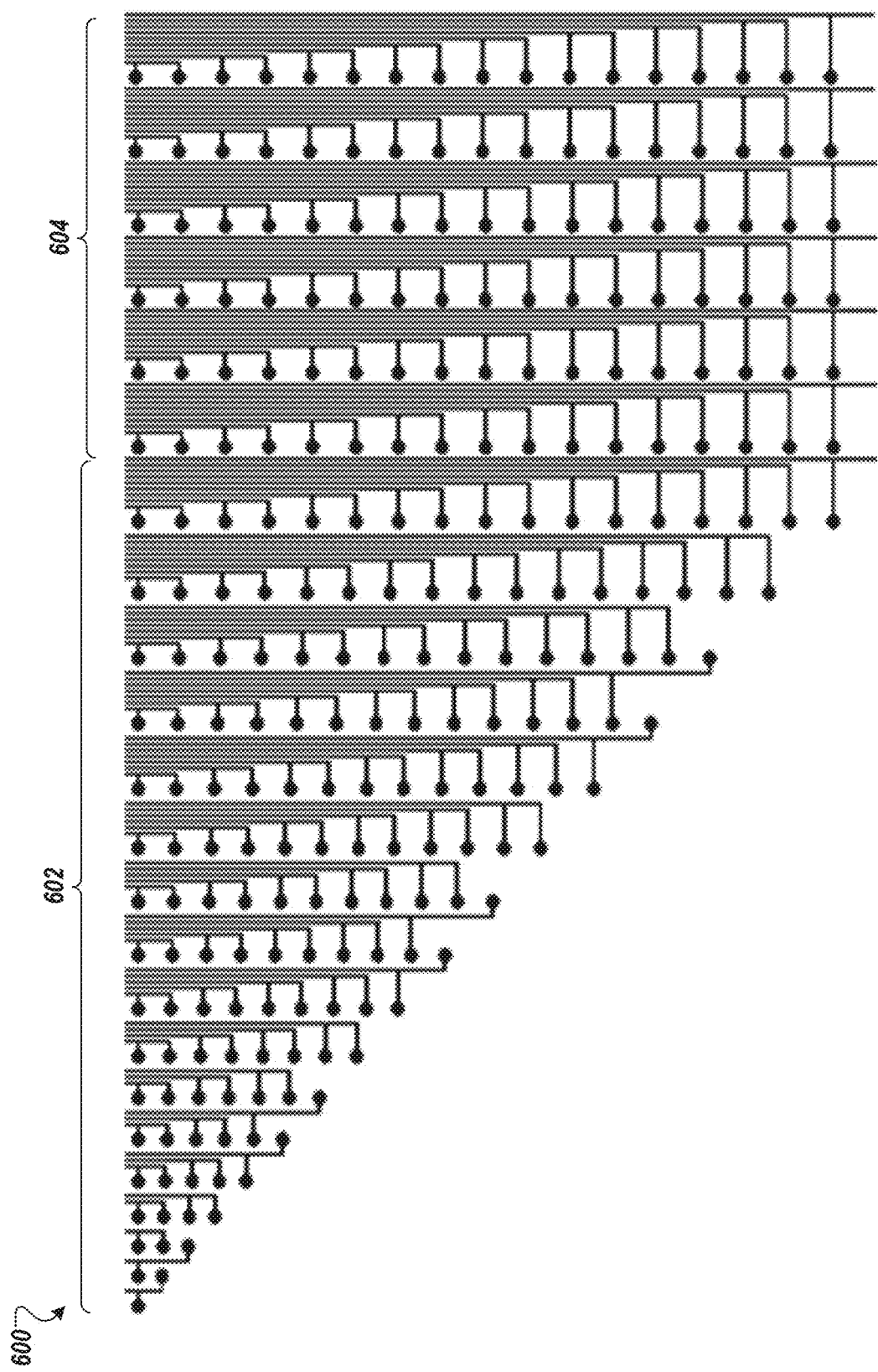
FIG. 6 illustrates a section of a circuit die with an array of bumps with a variable pitch according to at least one embodiment.

FIG. 6 illustrates a section 600 of a circuit die with an array of bumps with a variable pitch according to at least one embodiment. Section 600 includes a first region 602 of the array where a bump count per column increases, starting from a first corner at a first side of the section 600 to a second side of the section 600. When a routing field enters a second region 604, where the bump count is no longer increasing, the need to increase a routing track count and a bump pitch stops. Wiring channels in the second region 604 can include a same number of wiring tracks as the last wiring channel in the first region 602. When this pattern is repeated for the circuit die, the resulting circuit die can have a rectangular shape. In some cases, the number of metal tracks is just replicated laterally until the number of tracks begins to decrease near the opposite die corner. This leads to the conclusion that, unlike the conventional fixed pitch routing case, a rectangular die will produce a higher bump density for a rectangular die than for a square die having the same area.

It should be noted that a reasonable rule of thumb for many packaged die would lead to the requirement that roughly half the bumps/balls would be devoted to power and ground. It is easy to see that depending on the layer counts, additional design strategies can be used to reduce the impedance of these power connections. For example, in a four-layer system, the wires on two layers could be merged to produce entire planes for power and ground. Under less optimal conditions, the spaces between selected wires could also be filled with metal producing lower resistance routing for a power network.

It should be noted that several 2.5D package approaches provide routing of the connection wires with the chip bumps or pillars using vias to make desired connections. This geometry has a similar limitation as the blocking contacts presented in the previous sections but different values for the maximum chip size and ball density. The embodiments of the present disclosure with varying pitches can be similar in the non-blocking case but will also lead to different solutions to ball density compared to the blocking case.

It should also be noted that bumps/balls to be routed are often part of a circuit hierarchy that is not easy to adjust in an arbitrary way. When drivers and input-output (TO) circuits are purchased from an external vendor, the flexibility to adjust the space between bump points is not available. In such a case, where the local position of bumps in a sub-cell is fixed, the variable pitch idea can be applied to the placement position of the sub-cell rather than the bumps themselves. Assembled blocks of IO sub-cells are often highly problematic for package routing since the designer of the sub-cells has no knowledge of the environment in which they will be placed. The incentive of the IO block designer to deliver the densest possible cell placement often drives up the package layer count dramatically, particularly on large die. According to the principles of the present embodiments, the IO cells' variable pitch placement can therefore provide significant cost reduction.

The embodiments described herein can benefit from increasing the total number of bumps for varying die sizes without increasing the number of metal layers needed for the routing, as compared to conventional escape routing techniques. In particular, for an escape routing scenario with a vertical interconnect pitch of 10 microns, and a wire pitch of 2 microns, conventional routing techniques with fixed pitches between bumps can achieve a maximum bump count of 200 and a maximum die size of 0.0225 $mm^2$ for a single metal layer for routing; whereas routing with a variable pitch as described herein, a higher maximum bump count and a higher maximum die size can be achieved. For example, routing with a variable pitch on a single layer can achieve approximately 80,000 bump counts on a die size of approximately 400 $mm^2$. Using three metal layers, the conventional escape routing techniques with fixed pitches can achieve 2000 bump count and a die size of less than 0.25 $mm^2$, whereas routing with variable pitches can achieve a higher amount of bump counts for 0.25 $mm^2$ and greater die sizes, such as 200,000 bump count for a 400 $mm^2$ die size. Using five metal layers, the conventional escape routing techniques with fixed pitches can achieve 6000 bump count and a die size of less than 0.64 $mm^2$, whereas routing with variable pitches can achieve a higher amount of bump counts for 0.64 mm² and greater die sizes, such as 400,000 bump count for a 400 mm² die size. Using ten metal layers, the conventional escape routing techniques with fixed pitches can achieve less than 30,000 bump count and a die size of less than less than 4 mm², whereas routing with variable pitches can achieve a higher amount of bump counts for less than 4 mm² and greater die sizes, such as 700,000 bump count for a 400 mm² die size. Using thirty metal layers, the conventional escape routing techniques with fixed pitches can achieve less than 300,000 bump count and a die size of less than less than 16 mm², whereas routing with variable pitches can achieve a higher amount of bump counts for less than 16 mm² and greater die sizes, such as 2,000,000 bump count for a 400 mm² die size.

In another escape routing scenario with a vertical interconnect pitch of 130 microns, and a wire pitch of 20 microns, conventional routing techniques with fixed pitches between bumps can achieve a maximum bump count of 5,000 and a maximum die size of 1225 mm²; whereas routing with a variable pitch as described herein, a higher maximum bump count for the maximum die size of 1225 mm², such as 120,000 bump count. That is, the maximum die size that can be conventionally routed without modifications of the bump pitch or the metal layer count is limited with the fixed pitch routing. In a practical application, a two-step procedure can produce any targeted die size and total bump count and allow a cost comparison of the variable-pitch routing approach and the fixed-pitch routing approach. For example, using a single metal layer, a 55 micron bump pitch, and a desired die size of 1225 mm², conventional routing at 55 micron pitch can only produce a die size of a little less than 25 mm², but increasing the bump pitch from 55 microns to 130 microns allows a 1225 mm² die to be fully routed. The total bump count for the conventional fixed-pitch routing approach is about half that of the variable-pitch routing approach. Although this difference can be eliminated in the fixed-pitch routing approach by adding a second metal layer, the variable-pitch routing can achieve even higher bump counts or save the cost of not adding the second metal layer. By relaxing the bump pitch and adding more metal layers, the conventional fixed-pitch routing scheme can match the density of the variable-pitch routing, but at an increased cost.

For another example, a three layer 1225 mm² interposer routing design can have a vertical interconnect pitch of 10 microns, and a wire pitch of 2 microns, which represents a fairly aggressive scaled BGA or TSV technology, the conventional escape routing techniques with fixed pitches can achieve less than 160,000 bump count, whereas routing with variable pitches can achieve a higher amount of bump counts, such as approximately 370,000 bump count. For comparison purposes, the conventional escape routing techniques would have to add 4 additional metal layers to achieve a similar bump count. In addition to the increased cost for the additional layers (e.g., two times greater cost), the interposer design may not be possible as interposers are currently limited to a layer count of 3 or 4 metal layers.

In at least one embodiment, a first set of vertical interconnects is disposed in a first area of a substrate, the first area having a triangular shape. Each one of a first set of horizontal routing lines is coupled to one of the first set of vertical interconnects and a terminal at a first edge of the substrate. A first pitch size of the first set of vertical interconnects increases in a first repeating pattern from a first side of the first area to a second side of the first area. In a further embodiment, a second set of vertical interconnects is disposed in a second area of the substrate, the second area having a triangular shape. Each one of a second set of horizontal routing lines is coupled to one of the first set of vertical interconnects and a terminal at the first edge of the substrate. A second pitch size of the second set of vertical interconnects decreases in a second repeating pattern from a first side of the second area to a second side of the second area.

In another embodiment, a second set of vertical interconnects is disposed in a second area of the substrate, the second area having a triangular shape. Each one of a second set of horizontal routing lines is coupled to one of the first set of vertical interconnects and a terminal at a second edge of the substrate. A second pitch size of the first set of vertical interconnects increases in a second repeating pattern from a first side of the second area to a second side of the second area.

In one embodiment, the first area is a first octant of the substrate, and the substrate includes a second area that includes a second octant that is a mirror copy of the first area. The first area and the second area form a first quadrant of the substrate. The substrate can include a second quadrant that is a mirrored copy of the first quadrant about a first axis, a third quadrant that is a mirrored copy of the first quadrant about a second axis, and a fourth quadrant that is a mirrored copy of the first quadrant about a third axis. In another embodiment, the first triangular pattern is mirrored about a first axis to form a quadrant. In another embodiment, the circuit die includes an organic substrate, and the array of circuit die interconnects is a BGA disposed on the organic substrate. In other embodiments, the array of circuit die interconnects can be ball grids, bumps, pillars (e.g., copper pillars), or the like, and can include array routing out to edges of a PWB, OBGA package, interposers, or the like.

In some embodiments, the first repeating pattern begins with a first wiring channel located a first die corner of the circuit die with a first number of wires per wiring channel, and the first number of wires is repeated a second number of times for a first set of wiring channels based on a third number of metal layers. The first repeating pattern can increment the first number of wires (by one or another number) to a third number of wires and repeat for a fourth number of times for a for a next wiring channel after the first number of wires is repeated multiple times. An array of bumps can have a variable pitch and can be disposed on a rectangular die surface of any size. All bumps are fully routed to die edges using one or more wires on one or more metal layers. The wires have a fixed pitch and travel in channels perpendicular to the die edges between the bump columns. The pitch of adjacent bump columns begins at the minimum value in the die corner and increases by one wire pitch when the total number of wires in the previous channel is insufficient to connect to all bumps in the next channel.

In another embodiment, a semiconductor package includes an integrated circuit device with a plurality of conductive pads, a plurality of package terminals, and a plurality of conductive metal layers separated by insulating layers. The plurality of conductive metal layers includes signal lines formed in the plurality of conductive metal layers to route signals between the plurality of package terminals and the plurality of conductive pads of the integrated circuit device. As described herein, the plurality of conductive pads can include a variable pitch in a repeating pattern as described herein. The conductive pads can be BGA pads, controlled collapse chip connection (C4) solder bumps, copper-pillar bumps, or the like. Aspects of the present disclosure are applicable (but not limited) to ICs, packages, PCBs, and any multilayer device with at least two conductive metal layers and a dielectric layer in between the at least two conductive metal layers.

In one embodiment, a semiconductor package includes conductive metal layers separated by insulating layers, the conductive metal layers for routing signals between external package terminals and pads on an integrated circuit device. Signal lines formed in the conductive metal layers have electrode structures (capacitor electrode-like structures) formed for at least adjacent signaling lines of the package terminals. Two of the electrode structures from the adjacent signaling lines are formed opposite each other on different metal layers.

In one embodiment, a package includes an integrated circuit die with multiple conductive pads (or other types of terminals) that connect to multiple package terminals through signal lines. The signal lines can be disposed on multiple conductive metal layers separated by insulating layers. The signal lines formed in the conductive metal layers can route signals between the package terminals and the conductive pads. The signal lines can be wires, conductive traces, vias (also referred to as via transitions), or any combination of conductors that create an electrical path between a package terminal and a pad or terminal of the integrated circuit die. During package assembly, the interconnect terminal of the IC die is coupled to the interconnect terminal of the package. The integrated circuit die typically includes active and passive circuitry only on one side. For example, an integrated circuit die can include passive and active circuitry (e.g., transistors, diodes, resistors, capacitors, etc.). The semiconductor package can include package terminals, such as BGA pads (also referred to as BGA pins). During packaging, the package terminals are coupled to the terminals (e.g., conductive pads) of the integrated circuit die via a multi-level structure having multiple conductive metal layers with signal lines and crosstalk cancelation structures as described herein. The interconnect terminal types may be other types of interconnects than BGA pads, such as copper pillars, fan-out wafer-level packaging, chip-scale packaging (e.g., Wafer Level Chip Scale Packaging (WLCSP)), Package-on-Package (PoP), wafer bumping, controlled collapse chip connection (C4) solder bumps, conductive pads, or the like.

The methods, systems, and devices described above may be implemented in computer systems, or stored by computer systems. The methods described above may also be stored on a non-transitory computer-readable medium. Devices, circuits, and systems described herein may be implemented using computer-aided design tools available in the art, and embodied by computer-readable files containing software descriptions of such circuits. This includes, but is not limited to one or more elements of integrated circuits, integrated circuit dies, interconnects, etc., described above with respect to FIGS. 1A-6. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth above are merely exemplary. Particular implementations may vary from these exemplary details and still be contemplated to be within the scope of the present disclosure.

The description above includes specific terminology and drawing symbols to provide a thorough understanding of the present disclosure. In some instances, the terminology and symbols may imply specific details that are not required to practice the disclosure. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology, or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g. '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the disclosure has been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An apparatus comprising:
    a circuit die; and
    an array of circuit die interconnects located on the circuit die, wherein the array of circuit die interconnects comprises:
        a first triangular octant of interconnects organized in rows and columns, each column incrementing its number of interconnects from a first side of the first triangular octant to a second side of the first triangular octant, wherein a pitch size between the columns increases in a first repeating pattern from the first side to the second side; and
        a second triangular octant of interconnects organized in rows and columns, wherein the second triangular octant is a mirrored copy of the first triangular octant about an axis at the second side of the first triangular octant.

2. The apparatus of claim 1, wherein the array of circuit die interconnects comprises a third triangular octant of interconnects organized in rows and columns, wherein the third triangular octant is a mirrored copy of the first triangular octant about a diagonal axis between the first side and the second side of the first triangular octant.

3. The apparatus of claim 1, wherein the array of circuit die interconnects comprises a second triangular octant of interconnects organized in rows and columns, wherein each column of the second triangular octant decrements its number of interconnects from a first side of the second triangular octant to a second side of the second triangular octant, wherein a pitch size between the columns of the second triangular octant decreases in a second repeating pattern from the first side to the second side of the second triangular octant, wherein the first side of the second triangular octant is adjacent the second side of the first triangular octant, and wherein the first repeating pattern and the second repeating pattern are opposite repeating patterns.

4. The apparatus of claim 1, wherein the array of circuit die interconnects comprises a third triangular octant of interconnects organized in rows and columns, each row incrementing its number of interconnects from a first side of the third triangular octant to a second side of the second triangular octant, wherein a pitch size between the columns of the third triangular octant increases in a second repeating pattern from the first side to the second side of the third triangular octant, wherein a diagonal axis of the first triangular octant is adjacent to a diagonal axis of the third triangular octant, and wherein the first repeating pattern and the second repeating pattern are the same.

5. The apparatus of claim 1, wherein the first repeating pattern comprises:
    a first set of wiring channels, each wiring channel of the first set comprising a second set of routing wires in one or more routing layers of the circuit die, and each wiring channel of the first set comprising a first pitch size between respective columns; and
    a first wiring channel comprising a second set of routing wires in the one or more routing layers and comprising a second pitch size between respective columns, the second pitch size being greater than the first pitch size.

6. The apparatus of claim 5, wherein the first set of wiring channels comprises a first number of wiring channels that is based on a second number of the one or more routing layers.

7. The apparatus of claim 5, wherein the first repeating pattern further comprises:
    a second set of wiring channels, each wiring channel of the second set comprising a third set of routing wires in the one or more routing layers of the circuit die, and each wiring channel of the second set comprising a third pitch size between respective columns, the third pitch size being greater than the second pitch size; and a second wiring channel comprising a fourth set of routing wires in the one or more routing layers and comprising a fourth pitch size between respective columns, the fourth pitch size being greater than the third pitch size, wherein the first set of wiring channels and the second set of wiring channels comprises a first number of wiring channels that is based on a second number of the one or more routing layers.

8. The apparatus of claim 1, wherein:

the circuit die comprises a rectangular die surface;

the array of circuit die interconnects is an array of bumps disposed on the rectangular die surface; and each bump of the array of bumps is routed to a die edge using a wire, the wire having a fixed pitch and being located in a wiring channel that is perpendicular to the die edge and between two of the columns.

9. The apparatus of claim 8, wherein a first set of one or more wiring channels each comprises a first pitch size, wherein a second set of one or more wiring channels each comprise a second pitch size that is greater than the first pitch size by at least the fixed pitch of a wire, wherein the first set of one or more wiring channels is located at a first die corner of the circuit die and each channel of the first set has a first pitch size that accommodates one wire in each of a plurality of metal layers, and wherein the second set of one or more wiring channels is located adjacent to the first set of one or more wiring channels and each channel of the second set has a second pitch size that accommodates two wires in each of the plurality of metal layers.

10. An apparatus comprising:

a circuit die; and an array of circuit die interconnects located on the circuit die, wherein the array of circuit die interconnects comprises a first triangular octant of interconnects organized in rows and columns, each column incrementing its number of interconnects from a first side of the first triangular octant to a second side of the first triangular octant, wherein a pitch size between the columns increases in a first repeating pattern from the first side to the second side, wherein:

the circuit die comprises a rectangular die surface;

the array of circuit die interconnects is an array of bumps disposed on the rectangular die surface; and each bump of the array of bumps is routed to a die edge using a wire, the wire having a fixed pitch and being located in a wiring channel that is perpendicular to the die edge and between two of the columns.

11. The apparatus of claim 10, wherein a first set of one or more wiring channels each comprises a first pitch size, wherein a second set of one or more wiring channels each comprise a second pitch size that is greater than the first pitch size by at least the fixed pitch of a wire, wherein the first set of one or more wiring channels is located at a first die corner of the circuit die and each channel of the first set has a first pitch size that accommodates one wire in each of a plurality of metal layers, and wherein the second set of one or more wiring channels is located adjacent to the first set of one or more wiring channels and each channel of the second set has a second pitch size that accommodates two wires in each of the plurality of metal layers.

12. A semiconductor device comprising:

a substrate comprising a rectangular surface;

a first triangular octant of vertical interconnects disposed on the rectangular surface, the first triangular octant of vertical interconnects being organized in rows and columns, each column incrementing its number of interconnects from a first side of the first triangular octant to a second side of the first triangular octant;

a first set of wiring channels, each wiring channel of the first set comprising a first set of routing wires in one or more routing layers of the substrate, and each wiring channel of the first set comprising a first pitch size between respective columns; and a first wiring channel comprising a second set of routing wires in the one or more routing layers and comprising a second pitch size between respective columns, the second pitch size being greater than the first pitch size.

13. The semiconductor device of claim 12, wherein the first set of wiring channels comprises a first number of wiring channels that is based on a second number of the one or more routing layers, wherein the semiconductor device is or is a part of a printed wiring board (PWB), a ball grid array (BGA) package, an interposer, or a functional circuit block.

14. The semiconductor device of claim 12, further comprising:

a second set of wiring channels, each wiring channel of the second set comprising a third set of routing wires in the one or more routing layers of the substrate, and each wiring channel of the second set of wiring channels comprising a third pitch size between respective columns, the third pitch size being greater than the second pitch size; and a second wiring channel comprising a fourth set of routing wires in the one or more routing layers and comprising a fourth pitch size between respective columns, the fourth pitch size being greater than the third pitch size.

15. The semiconductor device of claim 14, wherein the first set of wiring channels and the second set of wiring channels comprises a first number of wiring channels that is based on a second number of the one or more routing layers.

16. The semiconductor device of claim 12, further comprising:

a second triangular octant of vertical interconnects disposed on the rectangular surface adjacent to the second side of the first triangular octant, the second triangular octant of vertical interconnects being organized in rows and columns, each column decrementing its number of interconnects from a first side of the second triangular octant to a second side of the second triangular octant;

a second set of wiring channels, each wiring channel of the second set of wiring channels comprising a third set of routing wires in one or more routing layers of the substrate, and each wiring channel of the second set of wiring channels comprising a third pitch size between respective columns; and a second wiring channel comprising a fourth set of routing wires in the one or more routing layers and comprising a fourth pitch size between respective columns, the fourth pitch size being less than the third pitch size.

17. The semiconductor device of claim 12, further comprising:

a second triangular octant of vertical interconnects disposed on the rectangular surface adjacent to a diagonal side of the first triangular octant, the second triangular octant of vertical interconnects being organized in rows and columns, each row incrementing its number of interconnects from a first side of the second triangular octant to a second side of the second triangular octant;

a second set of wiring channels, each wiring channel of the second set of wiring channels comprising a third set of routing wires in one or more routing layers of the substrate, and each wiring channel of the second set of wiring channels comprising a third pitch size between respective rows; and a second wiring channel comprising a fourth set of routing wires in the one or more routing layers and comprising a fourth pitch size between respective rows, the fourth pitch size being greater than the third pitch size.

18. An apparatus comprising:
a first set of vertical interconnects disposed in a first area of a substrate, the first area having a triangular shape;
a first set of horizontal routing lines, each coupled to one of the first set of vertical interconnects and a terminal at a first edge of the substrate, wherein a first pitch size of the first set of vertical interconnects increases in a first repeating pattern from a first side of the first area to a second side of the first area;
a second set of vertical interconnects disposed in a second area of the substrate, the second area having the triangular shape; and
a second set of horizontal routing lines, each coupled to one of the second set of vertical interconnects and a terminal at the first edge of the substrate, wherein a second pitch size of the second set of vertical interconnects decreases in a second repeating pattern from a first side of the second area to a second side of the second area.

19. The apparatus of claim 18, further comprising:
a third set of vertical interconnects disposed in a third area of the substrate, the third area having the triangular shape; and
a third set of horizontal routing lines, each coupled to one of the first third set of vertical interconnects and a terminal at a second edge of the substrate, wherein a second pitch size of the first set of vertical interconnects increases in a second repeating pattern from a first side of the second area to a second side of the second area.

20. The apparatus of claim 18, wherein:
the first area is a first octant of the substrate;
the second area is a second octant that is a mirrored copy of the first area, the first area and the second area forming a first quadrant of the substrate; and
the substrate comprises:
a second quadrant that is a mirrored copy of the first quadrant about a first axis;
a third quadrant that is a mirrored copy of the first quadrant about a second axis; and
a fourth quadrant that is a mirrored copy of the first quadrant about a third axis.

\* \* \* \* \*